United States Patent
Dupuis et al.

(10) Patent No.: US 7,053,718 B2
(45) Date of Patent: May 30, 2006

(54) STACKED RF POWER AMPLIFIER

(75) Inventors: Timothy J. Dupuis, Austin, TX (US); Susanne A. Paul, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/671,016

(22) Filed: Sep. 25, 2003

(65) Prior Publication Data

US 2005/0068103 A1    Mar. 31, 2005

(51) Int. Cl.
*H03F 3/04*    (2006.01)
(52) U.S. Cl. ...................... 330/311; 330/307
(58) Field of Classification Search ................ 330/311, 330/310, 251, 307, 98, 150; 257/500, 509, 257/548, 351
See application file for complete search history.

(56) References Cited

U.S. PATENT DOCUMENTS

| | | | | |
|---|---|---|---|---|
| 5,317,183 A | * | 5/1994 | Hoffman et al. | ............ 257/369 |
| 5,488,247 A | * | 1/1996 | Sakurai | ....................... 257/368 |
| 5,867,061 A | | 2/1999 | Rabjohn et al. | |
| 6,097,078 A | * | 8/2000 | Sim et al. | .................... 257/548 |
| 6,462,620 B1 | | 10/2002 | Dupuis et al. | |
| 6,549,071 B1 | | 4/2003 | Paul et al. | |
| 6,850,120 B1 | | 2/2005 | Heima et al. | |

OTHER PUBLICATIONS

IBM Whitepaper, "SOI Technology: IBM's Next Advance in Chip Design", http://www.at400.dk/pubfiles/soipaper.pdf, publication date unknown.

Chew, K.W., "Impact of Deep N-well Implantation on Substrate Noise Coupling and RF Transistor Performance for Systems-on-a-Chip Integration", 32nd European Solid State Device Research Conference, Sep. 24-26, 2002.

* cited by examiner

*Primary Examiner*—Henry Choe
(74) *Attorney, Agent, or Firm*—Johnson & Associates

(57) ABSTRACT

A method and apparatus provides techniques for electrically isolating switching devices in a stacked RF power amplifier, which prevents the switching devices from being subjected to high breakdown voltages. The isolation provided allows the power amplifier to be implemented on an integrated circuit.

25 Claims, 5 Drawing Sheets

STACKED RF POWER AMPLIFIER

FIELD OF THE INVENTION

This invention relates to power amplifiers. In particular, this invention is drawn to stacked RF power amplifiers.

BACKGROUND OF THE INVENTION

In some applications of power amplifiers, it is desired to provide a fixed envelope. For example, some cellular standards, such as GSM/DCS, require a fixed envelope. FIG. 1 shows a typical prior art implementation of a class E power amplifier design, which provides an output having a fixed envelope. FIG. 1 shows a power amplifier 10, which amplifies an RF input signal (RF IN) to provide an output signal to an antenna 16. The power amplifier 10 includes a pre-driver circuit 12 connected between the input signal RF IN and a switching device Q1, which operates essentially as a switch. The switching device Q1 is connected to inductor L1, capacitor C1, and transformation network 14. A voltage source $V_{BAT}$ is provided by a battery. To achieve high efficiency, the transformation network 14, inductor L1, and capacitor C1 are tuned to provide the waveform (at node $V_D$) shown in FIG. 2. FIG. 2 is plot of the voltage at node $V_D$ versus time. In FIG. 2, the peak voltage of the waveform shown will be approximately 3 to 4 times the supply voltage $V_{BAT}$.

Currently, typical cellular phone batteries provide a voltage in the range of 3.0 to 3.5 volts, which is based on the voltage of a Li-Ion cell or 3 Ni-Cad cells. At a supply voltage $V_{BAT}$ of 3.5 volts, the peak voltage in a class E power amplifier (e.g., the voltage at node $V_D$ in FIG. 1) will be approximately 10.5 to 14.0 volts. The requirement for a high voltage and a high cut-off frequency $f_T$ means that exotic technology devices, such as GaAs bipolars, FETs, LDMOS FETs, or SiGe bipolars could be used to meet these requirements. The requirements mentioned above, pose a large problem when attempting to integrate a power amplifier in CMOS, since CMOS transistors capable of running at GHz frequencies have maximum peak voltages of less than 5 volts.

SUMMARY OF THE INVENTION

An RF power amplifier according to one illustrative embodiment of the invention includes two power amplifiers fabricated in an integrated circuit. In this example, the power amplifiers are connected in a stacked arrangement. The power amplifiers each include a switching device which is electrically isolated from the other.

Another illustrative embodiment of the invention provides a method of making a stacked RF power amplifier. The stacked RF power amplifier is made on a CMOS integrated circuit while electrically isolating a switching device of the first power amplifier with a switching device of the second power amplifier. In one example, the switching devices are isolated using a deep N-well.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following description illustrates one example of a typical application of the present invention. A power amplifier using isolation techniques of the present invention may be used for any desired applications, including a wireless transmission system such as a mobile or cellular communication devices or other wireless device. In a wireless device, the wireless device may include a transceiver, an antenna duplexer, and an antenna. Connected between the transceiver and the antenna duplexer is an RF power amplifier for amplifying signals for transmission via the antenna. In the case of a wireless telephone application, the invention may be applied to GSM, CDMA, PCS, DCS, etc., or any other wireless systems. This is just one example of an application of a power amplifier utilizing the present invention. The invention may also be used in any other application requiring a power amplifier.

In general, the present invention provides techniques for electrically isolating switching devices in a stacked RF power amplifier, which prevents the switching devices from being subjected to high breakdown voltages. In one example, one or more switching devices are formed in a deep N-well, which isolates the switching devices from switching devices outside the deep N-well. Following is a detailed description of examples of the present invention.

Figure 1:
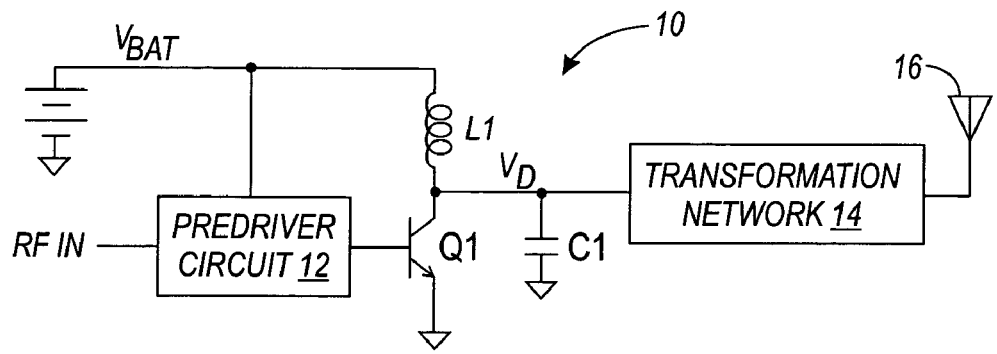
FIG. 1 shows a prior art class E power amplifier.
Figure 2:
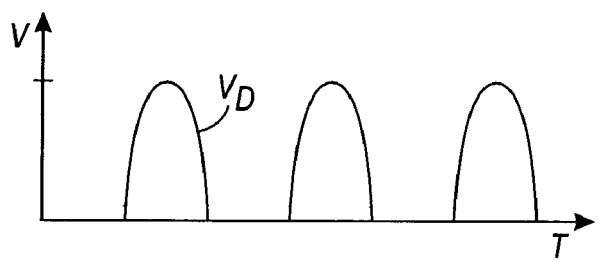
FIG. 2 is plot of the voltage at node $V_D$ of FIG. 1 versus time.
Figure 3:
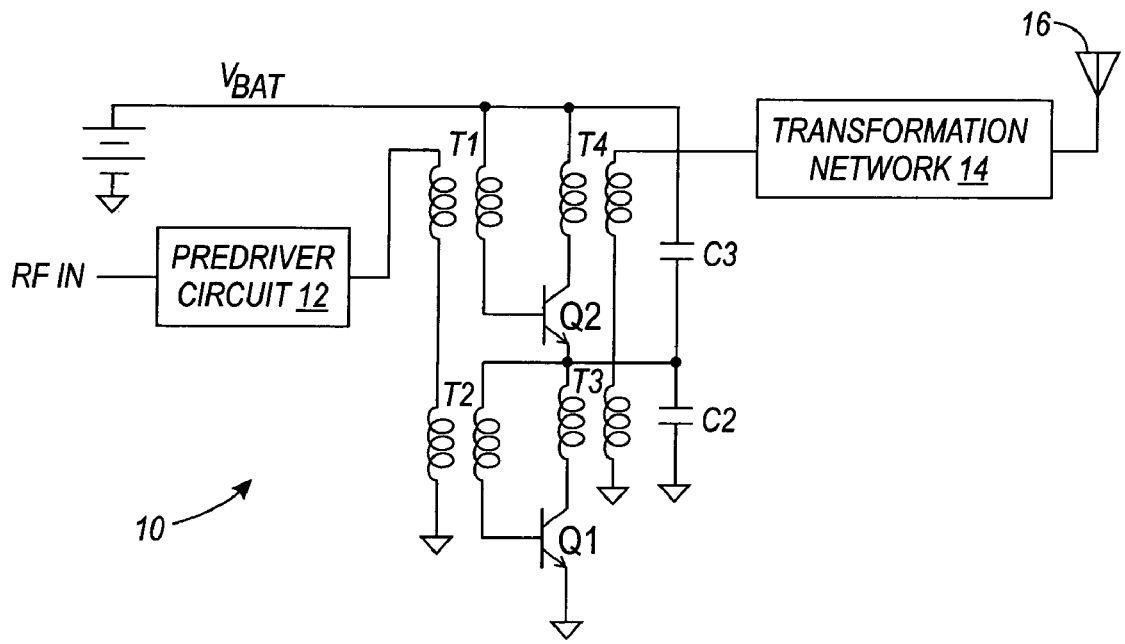
FIG. 3 is a diagram of a non-integrated stacked class E power amplifier.

FIG. 3 is a diagram of a non-integrated stacked class E power amplifier which may be used for very high power base-station applications, for example. FIG. 3 shows a power amplifier 10 which amplifies an RF input signal (RF IN) to provide an output signal to an antenna 16. The power amplifier 10 includes a predriver circuit 12 connected between RF IN and a first transformer T1, which is also connected to a second transformer T2. Each transformer T1 and T2 is connected to one of the parallel amplifiers of the stacked power amplifier 10. Transformer T2 is connected to switching device Q1 and transformer T3. Transformer T1 is connected to switching device Q2 and transformer T4. The transformers (or baluns) are used for the input and output coupling since the size and cost of this power amplifier are not dominant concerns for very high power applications. These types of applications could operate with very high supply voltages (e.g., 20–50 volts) and a plurality of stacked parallel power amplifiers, which limit the amount of voltage to which each individual transistor is subjected. However, the technique shown in FIG. 3 may not work in an integrated CMOS power amplifier since the integrated circuit will have a common substrate, which is connected to ground. This problem is discussed in more detail below.

Figure 4:
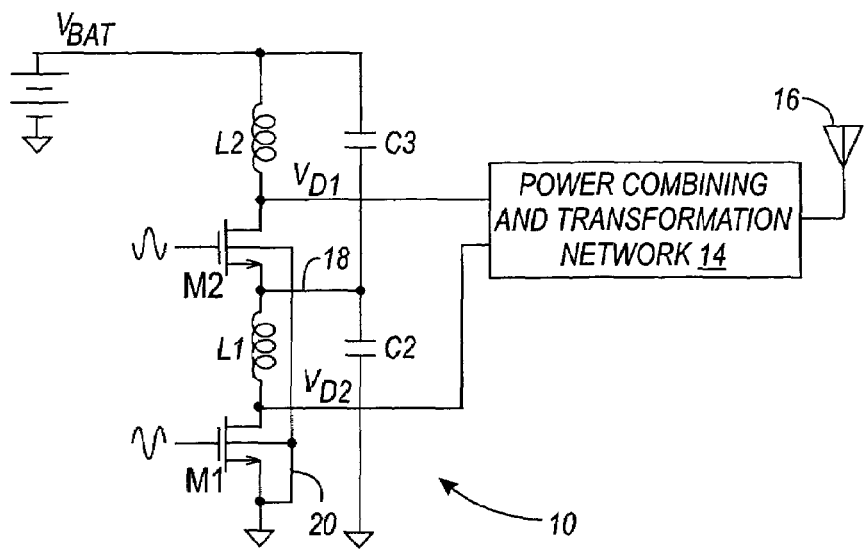
FIG. 4 is a diagram of an integrated stacked class E RF power amplifier.

As mentioned above, if non-integrated stacked class E power amplifiers (e.g., FIG. 3) are integrated into a CMOS semiconductor device, the switching devices in the resulting power amplifier would have breakdown voltage issues. FIG. 4 is a diagram of an integrated stacked class E RF power amplifier used to illustrate problems encountered with integrating stacked power amplifiers into an integrated circuit. FIG. 4 shows a differential class E power amplifier 10 having two parallel amplifiers, each with a switching device M1, M2 and an inductor L1, L2. For clarity, FIG. 4 omits any pre-driver circuitry. The inputs to the power amplifier 10 can be in or out of phase, depending on how the power combining and transformation network 14 is implemented. The differential outputs $V_{D1}$ and $V_{D2}$ are connected to a power combining and transformation network 14, which is connected to an antenna 16. In the example shown in FIG. 4, with a battery voltage ($V_{BAT}$) of 3.5 volts, the voltage at node 18 will be approximately half of $V_{BAT}$, or 1.75 volts. The peak voltage at node $V_{D2}$ will be less than 5.2 volts, which would allow the circuit of FIG. 4 to be implemented in CMOS. However, one problem with the example shown in FIG. 4 is that the peak voltage at node $V_{D1}$ may rise to approximately 7 volts, which will create breakdown issues with either the drain-substrate or gate-substrate of the switching device M2. As illustrated by connection 20 of FIG. 4, if the circuit of FIG. 4 is formed on an integrated circuit, the transistor bodies of the switching devices M1 and M2 are not isolated from one other.

Figure 5:
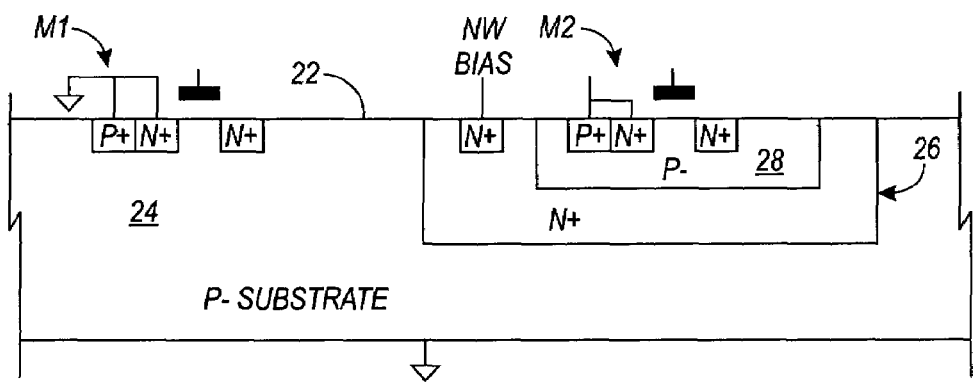
FIG. 5 is a diagram illustrating two isolated switching devices of the present invention formed on an IC.

As mentioned above, the present invention addresses the problems discussed above by electrically isolating two or more switching devices in a stacked power amplifier. In recent generations of CMOS and other technologies, a "deep N-well", or "triple well", is available. Generally, when using a deep N-well, three wells are present: an N-well, a P-well, and a deep N-well. Deep N-wells were developed to help with RF isolation issues, but are used in the present invention to permit the integration of a stacked CMOS power amplifier. FIG. 5 is a diagram illustrating two isolated switching devices of the present invention formed on an integrated circuit (IC). In FIG. 5, a deep N-well 26 is formed in the P⁻ substrate 24. A P-well 28 is formed within the deep N-well 26. FIG. 5 shows two NMOS switching devices M1 and M2 formed on IC 22. Switching device M1 is built in the P⁻ substrate 24, so that the P⁻ substrate 24 of the IC 22 serves as the transistor body of switching device M1. Switching device M2 is built within the deep N-well 26, which isolates the P⁻ substrate 24 from the P-well, or P⁻ substrate 28. Since the switching device M2 is formed in the deep N-well 26, the transistor body of switching device M2 (P⁻ substrate 28) is electrically isolated from the transistor body of switching device M1 (P⁻ substrate 26). FIG. 5 also shows a deep N-well bias (NW BIAS) that can be connected to the source of switching device M2 or to $V_{BAT}$, for example.

Note that other techniques may also be used to isolate switching devices M1 and M2. In addition to deep wells, the isolation can be provided by any other substrate isolation technology or any technique that electrically separates the transistor bodies of the switching devices. In another example, P wells can be formed using a semiconductor that is manufactured using N⁻ starting material, rather than P⁻ starting material (described in detail below). In another example, isolation is provided using silicon on insulator (SOI) technology (a semiconductor fabrication technique that uses crystal silicon and silicon oxide for ICs). Also, additional isolation can be provided. For example, a second deep N-well may be used so that both switching devices are isolated from the main substrate. Also, for power amplifiers having more stacked amplifiers, any desired number of switching devices can be isolated.

Figure 6:
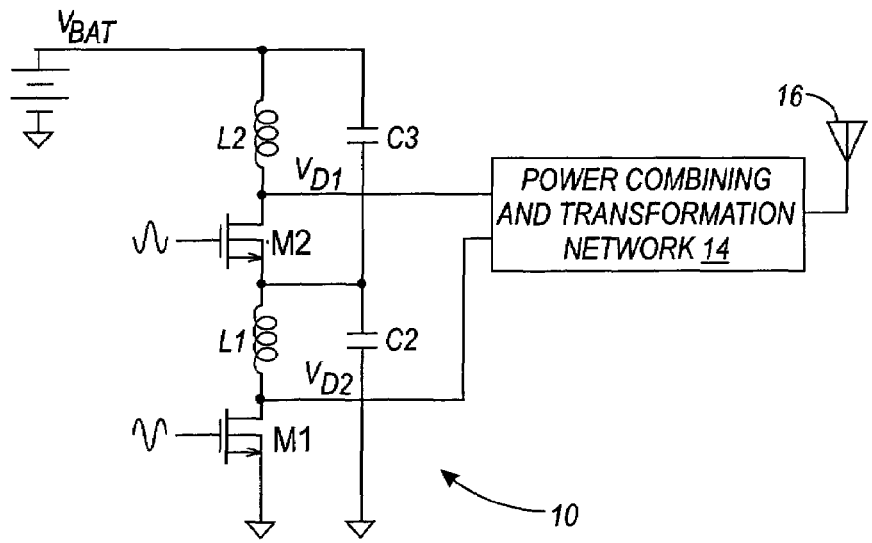
FIG. 6 is a diagram of an integrated stacked power amplifier built using the switching devices M1 and M2 shown in FIG. 5.

FIG. 6 is a diagram of an integrated stacked class E power amplifier built using the switching devices M1 and M2 shown in FIG. 5. FIG. 6 shows a power amplifier that is similar to the power amplifier shown in FIG. 4, except that the switching devices M1 and M2 are electrically isolated from each other using the deep N-well, as discussed above. Since switching devices M1 and M2 are isolated, there are no breakdown voltage issues.

Figure 7:
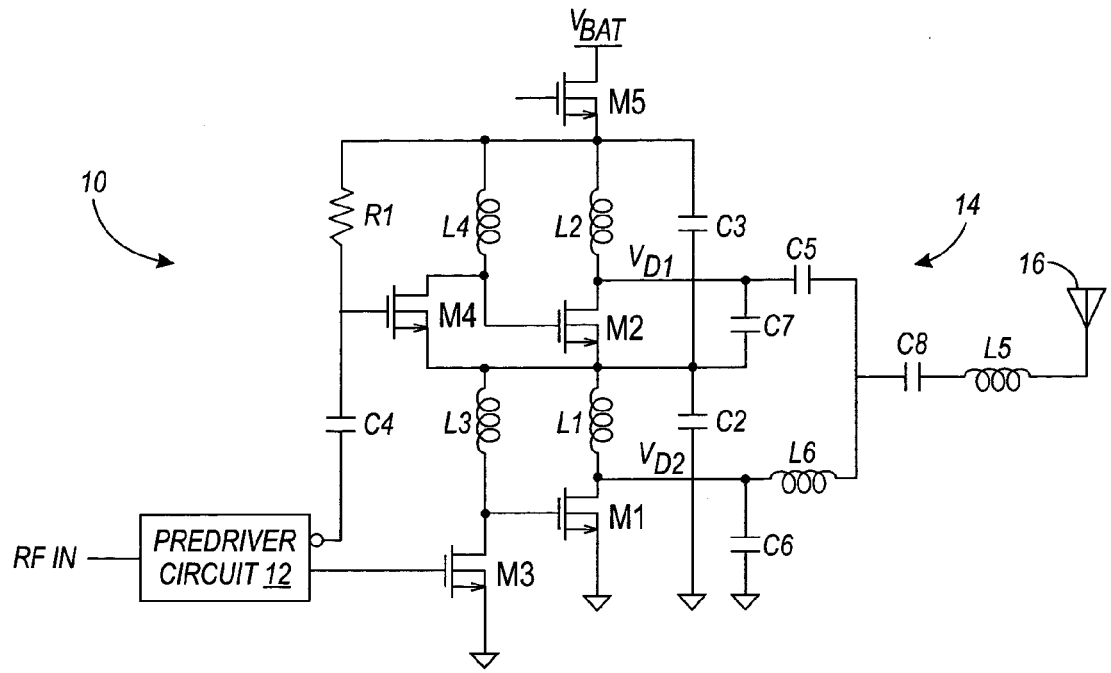
FIGS. 7–10 illustrate several examples of power amplifier designs using the isolation techniques of the present invention.
Figure 8:
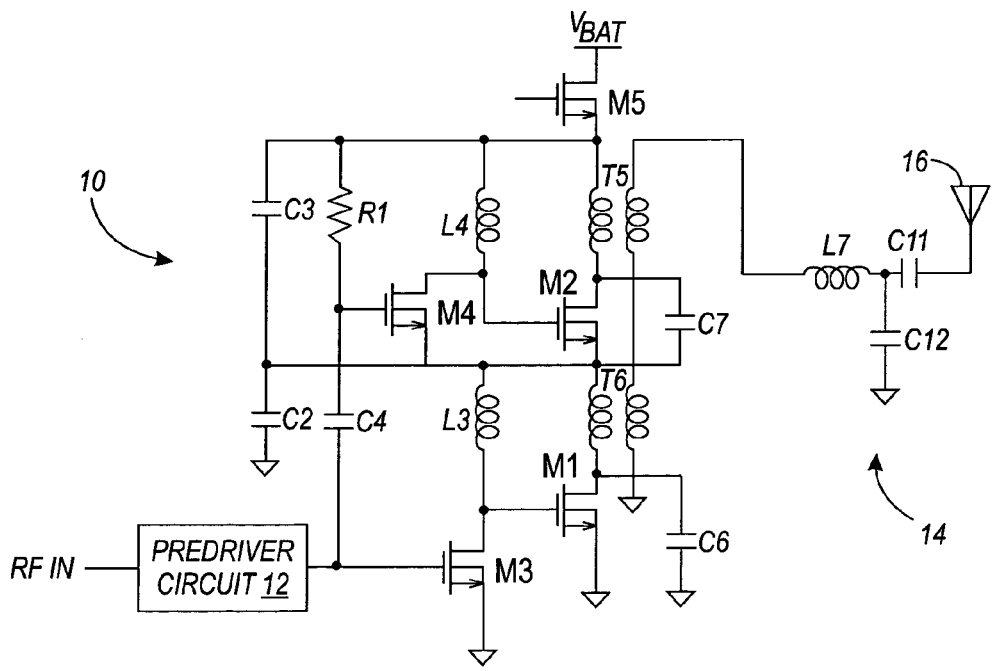
Figure 9:
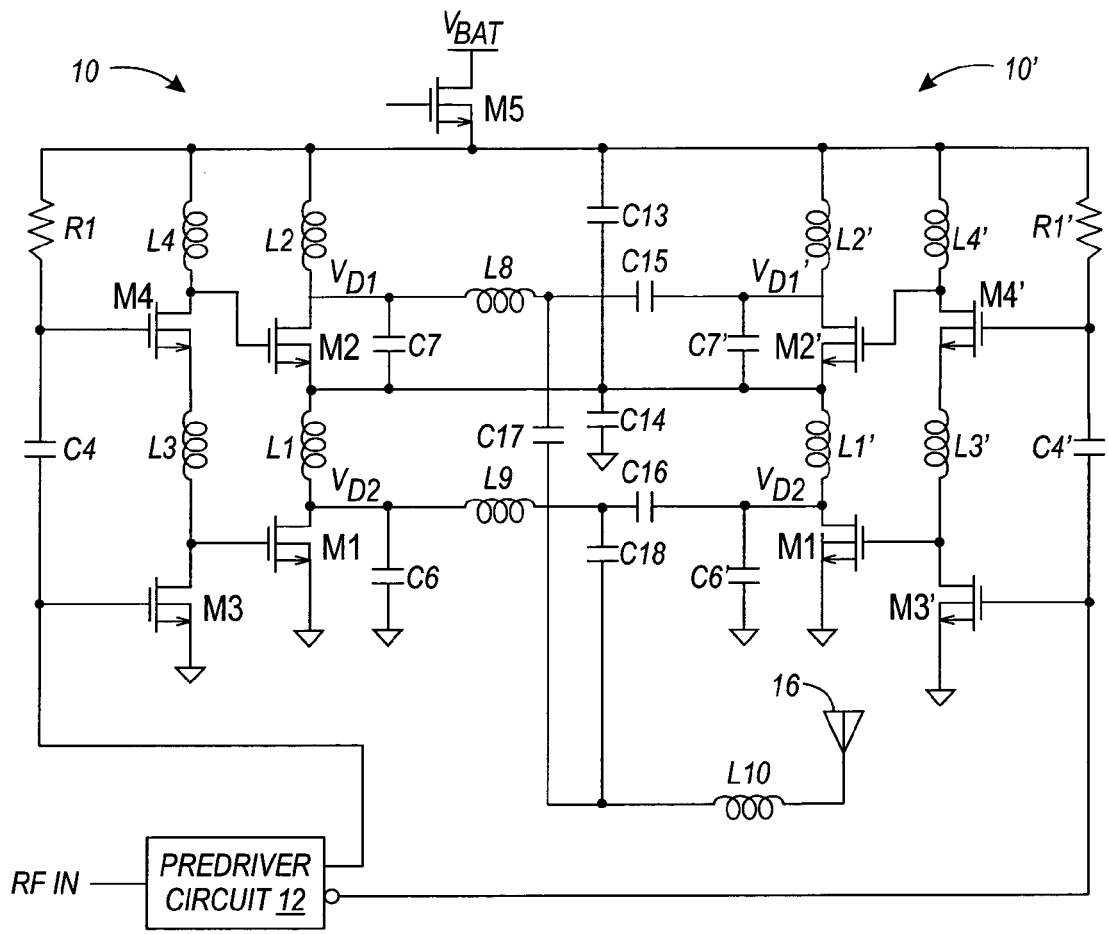
Figure 10:
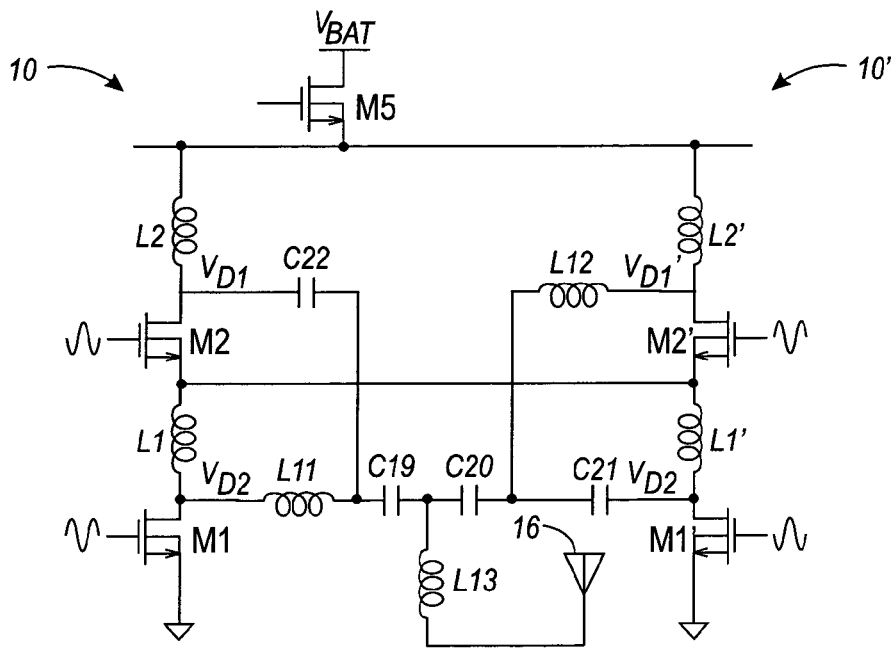

FIGS. 7–10 illustrate several examples of power amplifier designs using the isolation techniques of the present invention. FIGS. 7 and 8 illustrate examples of singled ended power amplifier designs. FIGS. 9 and 10 illustrate examples of differential power amplifier designs.

FIG. 7 shows a power amplifier 10 similar to the power amplifier shown in FIG. 6, but also illustrates an exemplary power combining and transformation network and input network. The power amplifier 10 of FIG. 7 includes two stacked power amplifiers, with each amplifier having a switching device M1, M2 and inductor L1, L2. The RF input signal RF IN is provided to predriver circuit 12, which has two outputs that are 180 degrees out of phase with each other. A pre-amplifier, comprised of switching devices M3, M4 and inductors L3 and L4, is coupled between the stacked power amplifiers and the predriver circuit 12. One of the outputs of the predriver circuit 12 is coupled to the gate of switching device M3. The other output of the predriver circuit 12 is coupled to the gate of switching device M4 via capacitor C4 and resistor R1. The output nodes $V_{D1}$ and $V_{D2}$ are coupled to the antenna 16 via the power combining and transformation network 14. The power combining and transformation network 14 includes inductors L5 and L6 and capacitors C5 and C8. FIG. 7 also shows a series voltage regulator, comprised of switching device M5 coupled to the voltage source $V_{BAT}$.

FIG. 8 shows a second example of a single ended power amplifier design of the present invention. The power amplifier shown in FIG. 8 is similar to the power amplifier shown in FIG. 7 with a transformer coupled output network. In FIG. 8, inductors L1 and L2 are replaced with transformers T6 and T5. The secondary sides of transformers T6 and T5 are coupled to the antenna 16 via a transformation network 14 comprised of inductor L7 and capacitors C11 and C12.

FIG. 9 shows an example of a differential power amplifier of the present invention. In FIG. 9, a first power amplifier 10 and a second power amplifier 10' are connected differentially as shown. The power amplifiers 10 and 10' of FIG. 9 are the identical to each other, although they are driven by RF input signals that are 180 degrees out of phase with each other. Each power amplifier 10 and 10' is the same as the power amplifiers shown in FIGS. 7 and 8, except for the output networks. The output nodes $V_{D1}$ and $V_{D2}$ of the power amplifier 10 are connected to inductors L8 and L9. The output nodes $V_{D1}'$ and $V_{D2}'$ of the power amplifier 10' are connected to capacitors C15 and C16. The inductors L8 and L9 and capacitors C15 and C16 are coupled to the antenna 16 via capacitors C17 and C18 and inductor L10.

FIG. 10 shows a second example of a differential power amplifier design of the present invention. In FIG. 10, a first power amplifier 10 and a second power amplifier 10' are connected differentially as shown. The power amplifiers 10 and 10' are the same as those shown in FIG. 9, except for the output network. Also, for clarity, the predrivers and preamplifiers are not shown in FIG. 10. In FIG. 10, the output nodes $V_{D1}$ and $V_{D2}$ of the power amplifier 10 are connected to capacitor C22 and inductor L11. The output nodes $V_{D1}'$ and $V_{D2}'$ of the power amplifier 10' are connected to inductor L12 and capacitor C21. The inductors L11 and L12 and capacitors C21 and C22 are coupled to the antenna 16 via capacitors C19 and C20 and inductor L13. Note that the power amplifiers shown in FIGS. 9–10 could also use other output transformation networks, in addition to the examples shown in the figures.

Figure 11:
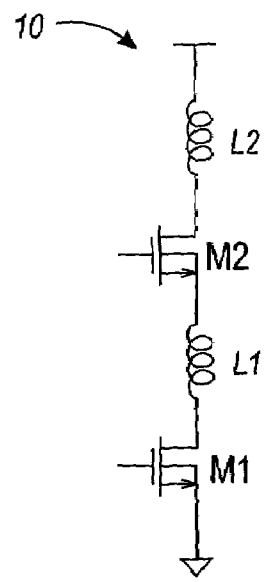
FIGS. 11–12 illustrate another embodiment of the present invention, where an integrated circuit is built using N⁻ starting material.
Figure 12:
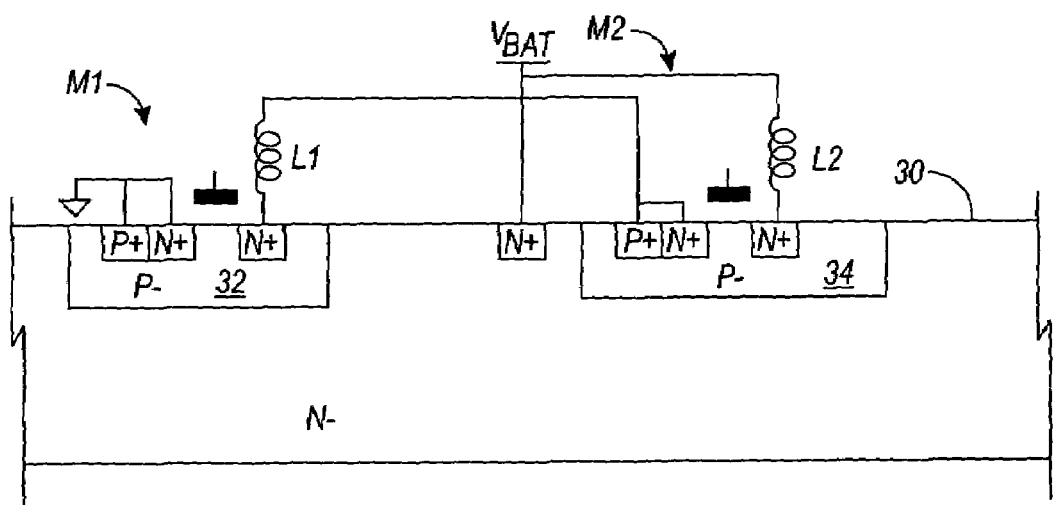

FIGS. 11–12 illustrate another embodiment of the present invention, where an integrated circuit is built using N⁻ starting material. FIG. 11 shows a stacked power amplifier 10 similar to the amplifiers discussed above. The power amplifier 10 has a first amplifier comprised of switching device M1 and inductor L1, and a second amplifier comprised of switching device M2 and inductor L2. FIG. 12 is a diagram illustrating the implementation of the power amplifier of FIG. 11 in an IC 30. The IC 30 is built using N⁻ starting material, rather than the industry-standard P⁻ starting material (e.g., FIG. 5). In this example, the switching devices M1 and M2 are NMOS transistors, and are formed within two P-wells 32 and 34 of the IC 30. The N⁻ started IC 30 allows the transistors to be isolated from one another, which permits the construction of the stacked power amplifier designs discussed above.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An RF power amplifier comprising:
   an integrated circuit;
   a first power amplifier formed on the integrated circuit, the first power amplifier having a first switching device;
   a second power amplifier tanned on the integrated circuit, the second power amplifier having a second switching device, wherein the first and second power amplifiers are connected in a stacked arrangement between a voltage supply and ground; and
   wherein the first and second switching devices are electrically isolated from each other.

2. The RF power amplifier of claim 1, wherein the first and second switching devices are electrically isolated by isolating the bodies of the first and second switching devices.

3. The RF power amplifier of claim 2, wherein the bodies of the first and second switching devices are isolated by forming one of the switching devices in a deep N-well.

4. The RF power amplifier of claim 3, wherein a bias voltage is applied to the deep N-well.

5. The RF power amplifier of claim 1, wherein the first and second switching devices are isolated by forming the integrated circuit using N⁻ starting material.

6. The RF power amplifier of claim 2, wherein the bodies of the first and second switching devices are isolated using silicon on isolator technology.

7. The RF power amplifier of claim 1, further comprising a third power amplifier formed on the integrated circuit the third power amplifier having a third switching device wherein the first, second and third switching devices are electrically isolated from each other.

8. The RF power amplifier of claim 1, wherein the integrated circuit is implemented using CMOS technology.

9. A method of making a stacked RF power amplifier comprising:
   providing a integrated circuit;
   forming first and second stacked power amplifiers on the integrated circuit, wherein the first and second stacked power amplifiers each include at least one switching device; and
   electrically isolating a switching device of the first power amplifier with a switching device of the second power amplifier.

10. The method of claim 9, wherein the step of electrically isolating a switching device of the first power amplifier with a switching device of the second power amplifier further comprises isolating the body of the first switching device from the body of the second switching device.

11. The method of claim 10, further comprising forming a deep N-well in the integrated circuit.

12. The method of claim 11, wherein the switching device of the second power amplifier is formed using the deep N-well to provide isolation from the switching device of the first power amplifier.

13. The method of claim 12, further comprising applying a bias voltage to the deep N-well.

14. The method of claim 10, further comprising using silicon on isolator techniques for isolating the body of the first switching device from the body of the second switching device.

15. A stacked RF power amplifier comprising:
   an integrated circuit;
   first and second stacked power amplifiers formed on the integrated circuit, wherein each power amplifier includes at least one switching device having a substrate; and
   wherein the body of a switching device in the first power amplifier is electrically isolated from the body of a switching device in the second power amplifier.

16. The stacked RF power amplifier of claim 15, wherein the isolation is provided by forming one of the switching devices in a deep N-well.

17. The stacked RF power amplifier of claim 16, wherein a bias voltage is applied to the deep N-well.

18. The stacked RF power amplifier of claim 15, wherein the isolation is provided by forming the integrated circuit using N⁻ starting material and forming the switching devices in P-wells.

19. The stacked RF power amplifier of claim 15, wherein the isolation is provided by using a silicon on isolator technique.

20. The stacked RF power amplifier of claim 15, wherein the integrated circuit is implemented using CMOS technology.

21. A stacked RF power amplifier formed on an integrated circuit comprising:
   a first amplifier having a first transistor formed on the integrated circuit, the first transistor of the first amplifier having a transistor body;
   a second amplifier having a second transistor formed on the integrated circuit, the second transistor of the second amplifier having a transistor body; and
   wherein the transistor body of the first transistor of the first amplifier is isolated from the transistor body of the second transistor of the second amplifier.

22. The stacked RF power amplifier of claim 21, wherein the transistor body of the first transistor of the first power amplifier is isolated from the transistor body of the second transistor of the second power amplifier by forming one of the transistors in a deep N-well.

23. The stacked RF power amplifier of claim 21, further comprising the steps of:
    forming the integrated circuit using N starting materials; and
    forming the first and second transistors of the first and second amplifiers in P-wells in the integrated circuit.

24. The stacked RF power amplifier of claim 21, wherein the transistor bodies of the first and second transistors of the first and second amplifiers are isolated using silicon on isolator technology.

25. The stacked RF power amplifier of claim 21, wherein the integrated circuit is implemented using CMOS technology.

* * * * *